United States Patent
Tanaka

(10) Patent No.: US 6,197,167 B1
(45) Date of Patent: *Mar. 6, 2001

(54) STEP COVERAGE AND OVERHANG IMPROVEMENT BY PEDESTAL BIAS VOLTAGE MODULATION

(75) Inventor: Yoichiro Tanaka, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/416,374

(22) Filed: Oct. 12, 1999

Related U.S. Application Data

(63) Continuation of application No. 08/989,759, filed on Dec. 12, 1997, now Pat. No. 5,976,327.

(51) Int. Cl.[7] .................................................. C23C 14/34
(52) U.S. Cl. ................. 204/192.15; 204/192.12; 204/192.22; 204/298.06; 204/298.08
(58) Field of Search .......................... 204/192.12, 192.15, 204/192.22, 298.06, 298.08

(56) References Cited

U.S. PATENT DOCUMENTS

| | | | |
|---|---|---|---|
| 4,756,801 | 7/1988 | Lamont, Jr. et al. | 204/192.3 |
| 4,865,712 | 9/1989 | Mintz | 204/298 |
| 4,963,329 | 10/1990 | Shimamura et al. | 204/192.12 |
| 4,999,096 | 3/1991 | Nihei et al. | 204/192.3 |
| 5,126,028 | 6/1992 | Hurwitt et al. | 204/192.13 |
| 5,178,739 | * 1/1993 | Barnes et al. | 204/192.15 |

(List continued on next page.)

FOREIGN PATENT DOCUMENTS

| | | | |
|---|---|---|---|
| 0 297 502 A2 | 1/1989 | (EP) | C23C/14/34 |

OTHER PUBLICATIONS

L.J. Kochel, "Pressure control of rf bias for sputtering," Rev. Sci. Instrum., vol. 47, No. 12, Dec. 1976, pp. 1555–1557.

Keizo Suzuki, Ken Ninomiya and Shigeru Nishimatsu, "Microwave plasma etching," Pergamon Press Ltd., vol. 34/No. 10/11 pp. 953–957, 1984.

S.M. Rossnagel and R. Sward, "Collimated magnetron sputter deposition with grazing angle ion bombardment," J. Vac. Sci. Technol. A. vol. 13 No. 1. Jan./Feb. 1995, pp. 156–158.

Toshiaki Yasui, Hirokazu Tahara, and Takao Yoshikawa, "Electron cyclotron resonance plasma generation using a planar ring–cusp magnetic field and a reentrant coaxial cavity," J. Vac. Sci. Technol. A 13(4), Jul./Aug. 1995, pp. 2105–2109.

W.M. Holber, J.S. Logan, H.J. Grabarz, J.T.C. Yeh, and J.B.O. Caughman, "Copper deposition by electron cyclotron resonance plasma," J. Vac. Sci. Technol. A 11(6), Nov./Dec. 1993 pp. 2903–2910.

Peter F. Cheng, and S.M. Rossnagel, "Directional deposition of Cu into semiconductor trench structures using ionized magnetron sputtering," J. Vac. Sci. Technol. B. 13(2), Mar./Apr. 1995 pp. 203–208.

(List continued on next page.)

Primary Examiner—Nam Nguyen
Assistant Examiner—Steven H. Ver Steeg
(74) Attorney, Agent, or Firm—Thomason, Moser & Patterso

(57) ABSTRACT

The invention provides a method for depositing a metal film on a substrate, comprising generating a high density plasma in a chamber, sputtering metal particles from a target to the substrate, and applying a modulated radio frequency (RF) bias to the substrate during deposition. Another aspect of the invention provides an apparatus for depositing a metal film on a substrate comprising a high density plasma physical vapor deposition (HDP PVD) chamber and a controller to modulate a RF bias power applied to a substrate in the chamber.

20 Claims, 2 Drawing Sheets

U.S. PATENT DOCUMENTS

| | | | |
|---|---|---|---|
| 5,302,266 | 4/1994 | Grabarz et al. | 204/192.12 |
| 5,303,139 | 4/1994 | Mark | 363/63 |
| 5,346,600 | 9/1994 | Nieh et al. | 204/192.3 |
| 5,510,011 | 4/1996 | Okamura et al. | 204/192.3 |
| 5,584,974 | 12/1996 | Sellers | 204/192.13 |
| 5,770,023 | 6/1998 | Sellers | 204/192.3 |
| 5,810,963 | 9/1998 | Tomioka | 156/345 |
| 5,858,184 | 1/1999 | Fu et al. | 204/192.17 |
| 5,976,327 * | 11/1999 | Tanaka | 204/192.15 |

OTHER PUBLICATIONS

P. Kidd, "A magnetically confined and electron cyclotron resonance heated plasma machine for coating and ion surface modification use," J. Vac. Sci. Technol. A. vol. 9 No. 3 May/Jun. 1991 pp. 466–473.

M. Yamashita, "Fundamental characteristics of built–in–high–frequency coil–type sputtering apparatus," J. Vac. Sci. Technol. A. 7(2), Mar./Apr. 1989, pp. 151–158.

Seiji Samukawa, "Wave propagation and plasma uniformity in an electron cyclotron resonance plasma," J. Vac. Sci. Technol. A 11(5), Sep./Oct. 1993, pp. 2572–2576.

Christopher Apblett, Manuel F. Gonzales, J. Charles Barbour, Lisa–Marie Gonzales–Petersen, Matthew Kovacs, Bryan Kuhr, "Silicon nitride growth in a high–density plasma system," Nov. 1995 Solid State Technology pp. 73–74,76,78 and 80.

Keizo Suzuki, Sadayuki Okudaira, Noriyuki Sakudo and Ichiro Kanomata, "Microwave Plasma Etching," Journal of Applied Physics, vol. 16, No. 11, Nov., 1977 pp. 1979–1984.

Ward D. Getty, Joseph B. Geddes, "Size–scalable, 2.45 GHz electron cyclotron resonance plasma source using permanent magnets and waveguide coupling," J. Vac. Sci. Technol. B 12(1), Jan./Feb. 1994, pp. 408–415.

S. Hamaguchi and S.M. Rossnagel, "Simulations of trench–lling pro les under ionized magnetron sputter metal deposition," J. Vac. Sci. Technol. B 13(2). Mar./Apr. 1995, pp. 183–191.

Seitaro Matsuo, "Reactive Ion–Beam Etching and Plasma Deposition Techniques Using Electron Cyclotron Resonance Plasmas," Applied Solid State Science, Academic Press, Inc., 1985 pp. 75–117.

S.M. Gorbatkin, D.B. Poker, R.L. Rhoads, C. Doughty, L.A. Berry and S.M. Rossnagel, "Cu metallization using a permanent magnet electron cyclotron resonance microwave plasma/sputtering hybrid system," J. Vac. Sci. Technol. B 14(3), May/Jun. 1996, pp. 1853–1859.

I.S. Park, S. I. Lee, Y.J. Wee, W.S. Jung, G.H. Choi, C.S. Park, S.H. Park, S.T. Ahn, M.Y. Lee, Y.K. Kim and R. Reynolds, A Novel Al–Reflow Process Using Surface Modification by the ECR Plasma Treatment and Its Application to the 256Mbit DRAM, IEDM 94, 109–112, pp. 5.4.1–5.4.4, 1994.

H. Koenig and E. Stern, "RF Sputtering System with Variable Substrates Bias," IBM Technical Disclosure Bulletin vol. 13 No. 2 (Jul. 1970), pp. 323–324.

U.S. Patent Application Entitled: "Selective Physical Vapor Deposition Conductor Fill In IC Structures," Serial No. 08/768,058, Filed Dec. 16, 1996, Inventors: Ramaswami, et al.

U.S. Patent Application Entitled "Use of Pulsed–DC Wafer Bias for Filling Vias/Trenches with Metal in HDP Physical Vapor Deposition," Serial No. 08/880,467; Filing Date Jun. 23, 1997; Inventors: Tse–Yong Yao et al.

* cited by examiner

STEP COVERAGE AND OVERHANG IMPROVEMENT BY PEDESTAL BIAS VOLTAGE MODULATION

This application is a continuation of U.S. patent application No. 08/989,759, which was filed on Dec. 12, 1997 and is now U.S. Pat. No. 5,976,327.

BACKGROUND OF THE INVENTION

1. Field of the Invention

The present invention generally relates to physical vapor deposition of a metal film. More particularly, the present invention relates to high density plasma physical vapor deposition of a metal into high aspect ratio features on a substrate surface.

2. Background of the Related Art

Physical vapor deposition (PVD) or sputtering is a known technique used in the manufacture of integrated circuits. In PVD, a target of a desired coating material is bombarded by ions accelerated thereto to dislodge and eject target material from the target which is then deposited onto a substrate. The target and the substrate to be coated are generally placed in a vacuum chamber which is evacuated to and maintained at a pressure of less than about 10 milliTorr. Typically, a heavy inert gas such as argon is supplied to the vacuum chamber and a pumping system maintains the desired gas pressure in the chamber. A glow discharge plasma is created in the low pressure argon, at least partially ionizing the gas, by supplying a high negative DC, AC or RF potential to a cathode (typically the target) and grounding the chamber walls and an anode (typically the substrate). The glow discharge plasma is created in the space between the cathode and the anode, and is generally separated from the electrodes by a dark space or plasma sheath. Since the plasma itself is a good conductor, the plasma remains at essentially a constant positive potential with respect to the negatively biased cathode. This produces an electric field at the target that is substantially perpendicular to the exposed surface of the target. Thus, positive ions from the plasma are accelerated across the dark space onto the exposed surface of the target following trajectories substantially perpendicular to the exposed front surface of the target resulting in sputtering of the target.

The goal in most deposition processes is to deposit a film of uniform thickness across the surface of a substrate, while also providing good fill of lines, interconnects, contacts, vias and other features formed on the substrate. The most widely used metal deposition materials include tungsten (W), titanium (Ti), titanium nitride (TiN), aluminum (Al), and copper (Cu). As device geometries shrink, it has become increasingly difficult to deposit materials to form conformal barriers and liners, such as Ti and TiN, into these device features to form low resistance interfaces.

With recent decreases in the size of semiconductor devices and corresponding decreases in device features to less than a quarter micron (<0.25 μm) in aperture width, conventional sputtering (i.e., PVD) has not been satisfactory in providing sufficient deposition thickness at the base of high aspect ratio features, i.e. those where feature depth exceeds the feature width. Furthermore, conventional PVD can cause overhang, or a crowning effect in the region near the top corners of the feature opening, and thereby restrict the path for subsequent deposition. Thus, an advanced deposition process is required to deposit metals in these smaller features having increased aspect ratios and to achieve sufficient bottom coverage.

More recently, high density plasma (HDP) processes, including ionized metal plasma (IMP), have been used to enhance deposition into these features. Generally, a HDP PVD chamber, as shown in FIG. 2, includes a target 11, a substrate support pedestal 18, a RF inductive coil 31 disposed in the region between the target and the substrate, and a substrate power supply 48. To improve bottom coverage, HDP PVD uses a high density plasma between a sputtering target and a substrate to ionize a high fraction of sputtered atoms before depositing onto the substrate. These ions are accelerated perpendicularly towards the surface of the substrate within a plasma sheath, improving the selective or preferential filling of high aspect ratio features. Additionally, biasing of the substrate relative to plasma potential is widely used in HDP PVD to control the energy of ions reaching the substrate and improve results. The bias voltage can be applied directly to the substrate support, or to a conductive substrate or a conductive layer on the substrate through the support. With a non-conductive or highly resistive substrate, a radio frequency (RF) bias voltage can be capacitively coupled to the substrate. The radio frequency of the RF bias is typically between 10 Kilohertz and 300 Megahertz.

An example of a PVD system capable of improved deposition into small high aspect ratio features is the VECTRA™ IMP PVD System, available from Applied Materials, Inc., Santa Clara, Calif. The IMP PVD system improves bottom coverage and reduces the overhang formation by directing the sputtered metal particles normal to the substrate surface so that the particles can deposit into deep, sub-quarter micron features. An RF powered coil is placed between the target and the substrate to create a dense plasma ($n \approx 10^{12}$ cm$^{-3}$) in the space between the target and the substrate. Sputtered metal atoms become ionized as they travel through this region. As the ionized metal atoms approach the plasma boundary near the substrate, the electric field caused by the applied substrate and/or the substrate support bias directs the ionized metal atoms normal to the substrate surface. Because the ionized metal atoms are traveling normal to the surface of the substrate, they can deposit into the bottom of high aspect ratio features without hitting the side walls of the features and forming overhangs. Generally, the IMP PVD system can achieve sufficient bottom coverage without forming significant overhangs.

However, an applied bias to the substrate causes re-sputtering of the deposited material at the top portion of the feature aperture. The amount of re-sputtering increases with the power of the applied bias to the substrate. The re-sputtered material deposits onto the side walls of the aperture and forms overhangs. This undesirable crowning effect restricts subsequent deposition into the aperture. Because the bottom coverage and the formation of overhangs depends on the bias power applied at the surface of the substrate, HDP PVD still presents problems when a higher bottom coverage is desired. FIG. 1a is a cross sectional view of a high aspect ratio feature deposited using HDP PVD techniques at a high (≈400 W) electrostatic chuck bias, and FIG. 1b is a cross sectional view of a high aspect ratio feature deposited using HDP PVD techniques at a low (≈200 W) electrostatic chuck bias. Both FIGS. 1a and 1b illustrate deposition of 1000 Å of titanium nitride (TiN) on the surface of the substrate. When high bias is applied, bottom coverage improves to between 35% and 46% in a high aspect ratio feature having 0.35 μm width and 1.2 μm depth. However, the high bias causes re-sputtering of the deposited material from the deposited material near the top edge of the feature to form large overhangs on the side walls near the upper portion of the aperture, which again restricts subsequent deposition. When low bias is applied, the overhang formation is minimized, but the bottom coverage decreases as well because a lesser amount of deposition is directed by the substrate bias to the bottom of the feature.

Therefore, there remains a need for a metal deposition process for high aspect ratio sub-quarter micron features that can achieve good bottom coverage while minimizing overhang formations near the openings of features formed on substrates.

SUMMARY OF THE INVENTION

The invention generally provides a method for depositing a metal film on a substrate, comprising generating a high density plasma in a chamber, sputtering metal particles from a target to the substrate, and applying a modulated radio frequency (RF) bias to the substrate during deposition. In one aspect of the invention, the modulated RF bias comprises cycling between a first RF bias and a second RF bias. Preferably, the modulation cycle of the substrate bias is repeated during deposition of a metal film to achieve high bottom coverage and minimal overhang.

Another aspect of the invention provides an apparatus for depositing a metal film on a substrate comprising a high density plasma physical vapor deposition (HDP PVD) chamber and a controller to modulate a RF bias power applied to a substrate in the chamber.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
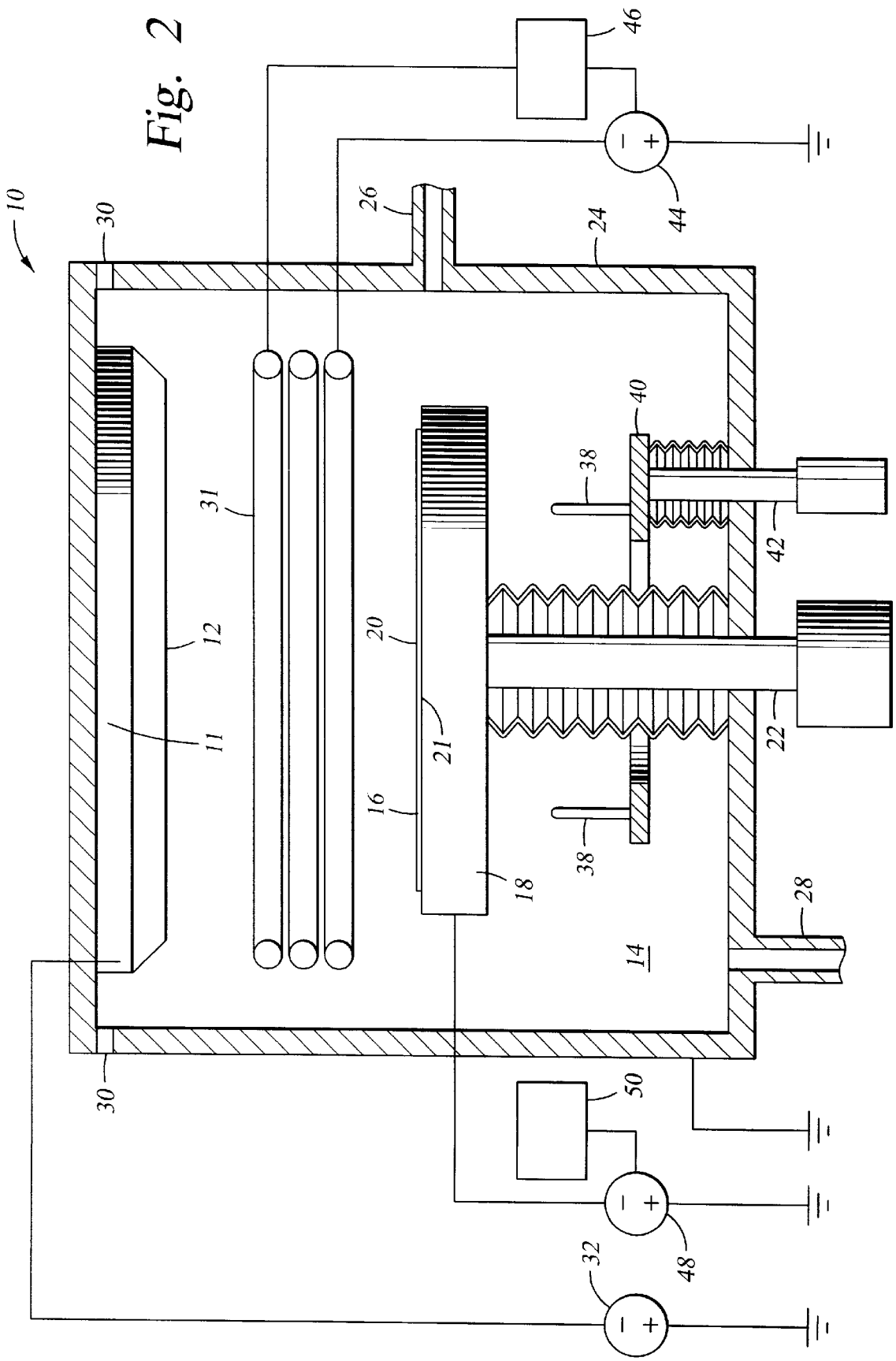
FIG. 2 is a cross-sectional view of a simplified HDP PVD apparatus of the present invention.

FIG. 2 is a cross-sectional view of a simplified HDP PVD apparatus of the present invention. The HDP PVD apparatus 10 generally includes a vacuum chamber 14 having a chamber enclosure wall 24 which includes at least one gas inlet 26 and an exhaust outlet 28 connected to an exhaust pump (not shown). A substrate support pedestal 18 having a substrate receiving surface 21 for receiving a substrate 16 thereon is typically connected to a lift mechanism 22 or other actuator disposed through the bottom portion of the chamber enclosure. The substrate support pedestal is preferably a biasable (RF power) electrostatic chuck. A target 11, typically disposed in the top portion of the chamber, provides a sputtering surface 12 positioned to deposit sputtered material onto a top surface 20 of the substrate 16. The target 11 is electrically isolated from the enclosure wall 24 by an insulating member 30 and the enclosure wall 24 is preferably grounded, so that a negative voltage may be maintained on the target 11 with respect to the grounded enclosure wall 24. The chamber 14 further includes an inductive coil 31 coupled to a RF coil power supply 44 to provide an inductively coupled plasma in the region between the target 11 and the substrate 16. Optionally, a shield (not shown) having an annular, upturned, wall on which an annular cover ring (not shown) is suspended, divides the chamber into an upper processing portion and a lower non-processing portion and protects the lower portion of the chamber from deposition.

The substrate 16 is typically passed through a load lock (not shown) communicating with a slit valve (not shown) in the enclosure wall 24, and positioned on the substrate support pedestal 18 within the chamber 14 by a robot arm, blade or other substrate handling device (not shown). In preparation for receiving a substrate, the substrate support pedestal 18 is lowered by a lift mechanism 22 to the lower portion of the chamber, below the slit valve through which the substrate passes. The pedestal 18 typically includes three or more vertical bores (not shown), each of which allows a vertically slidable lift pin 38 to pass therethrough. The lift pins 38 are preferably disposed on a lift pin platform 40 which is connected to a lift pin actuator 42. When the pedestal 18 is in the lowered position as just described, the upper tip of each lift pin 38 protrudes above the substrate receiving surface 20 of the pedestal 18. The upper tips of the lift pins 38 define a plane parallel to the substrate receiving surface 20 of the pedestal 18.

A conventional robot arm (not shown) typically carries the substrate into the chamber and positions the substrate 16 above the upper tips of the lift pins 38. The lift pin actuator 42 moves the lift pin platform 40 upwardly, to place the upper tips of the lift pins against the underside of the substrate 16 and additionally lift the substrate off the robot blade (not shown). The robot blade then retracts from the chamber 14, and the lift mechanism 22 raises the pedestal 18 above the tips of the lift pins 38, thereby placing the substrate 16 onto the substrate receiving surface 20 of the pedestal 18. The lift mechanism 22 continues to raise the pedestal 18 until the substrate 16 is at an appropriate distance from the target 11 so that the deposition process can begin. At this position, the pedestal 18 engages the shield (not shown) and the annular clamp ring (not shown) so that the lower portion of the chamber is protected from deposition. Because the inner diameter of the clamp ring is typically slightly smaller than the diameter of the substrate 16, the edge of the substrate 16 and the edge of the pedestal 18 are also protected from deposition.

Sputter deposition processes are typically performed in a gas such as argon that is charged into the vacuum chamber 14 through the gas inlet 26 at a selected flow rate regulated by a mass flow controller. For TiN deposition, nitrogen gas ($N_2$) is flown in the chamber to react with the sputtered Ti to form TiN. Typically, argon is flown at about 10 to 100 sccm and nitrogen is flown at about 10 to 200 sccm to provide deposition of TiN films.

A sputter power supply 32 applies a negative voltage to the target 11 with respect to the enclosure wall 24 so as to excite the gas into a plasma state. Ions from the plasma bombard the target surface 12 and sputter target material from the target 11. The sputter power supply 32 used for target biasing purposes may be any type of power supply as desired, including DC, pulsed DC, AC, RF and combinations thereof.

A RF coil power supply 44 is connected to the inductive coil 31 to generate a high density plasma in the region between the target and the substrate. Preferably, the RF coil power supply 44 is configured to a frequency of 13.56 MHz and calibrated for appropriate chamber conditions. A RF coil match 46 is provided to adjust the RF coil power supply's forward and reflected power. Once the RF coil power supply 44 is matched with the RF coil, an ionized metal plasma can be generated in the chamber.

A substrate bias RF power supply 48 provides an RF bias to the substrate to direct ionized metal particles to the bottom of high aspect ratio features and re-sputter deposited material from the substrate. The invention provides a substrate bias RF power supply controller 50 to control the bias power applied to the substrate and the modulation of the RF bias power. Preferably the controller 50 is a programmable microprocessor, but other switching controls can be utilized as well. Typically, substrate bias power ranges from 100 W to 500 W (for a 200 mm substrate) with an increasing bottom coverage corresponding to increasing power. The power densities across the surface of the substrate can be calculated by dividing the power applied with the surface area of the substrate (power/$\pi r^2$). For example, the power density for a substrate bias power of 500 W applied over a 200 mm substrate is (500 W/($\pi$(100 mm)$^2$)) which is approximately 0.0159 W/mm$^2$. Likewise, for a 100 W bias, the power density calculated on the same basis would be about 0.0032 W/mm$^2$; for 200 W, the power density would be about 0.0064 W/mm$^2$; and for 300 W, the power density would be about 0.0095 W/mm$^2$.

However, faceting and re-sputtering of deposited material at the aperture edge also increase with an increased power, particularly with thick films (≈1000 Å). The materials re-sputtered from the deposited material near the top edge of the aperture form overhangs (or produce a crowning effect) on the side walls near the upper portion of the aperture which restrict the path of subsequent deposition into the feature. In order to suppress this crowning effect, the invention provides a modulated RF bias on the substrate, cycling preferably between a high bias power of about 500 W and a low bias power of about 200 W for a 200 mm substrate. Different combinations of modulation and bias power can be optimized for the desired bottom coverage and allowable overhang formation as well as the desired film quality. However, it is important to select an appropriate bias power because bias power has a significant effect on film quality. For TiN films, an extremely low bias power (on the order of about 100 W over a 200 mm substrate) tends to density the film and increase the grain size of the deposited material while an excessively high bias power (on the order of about 750 W over a 200 mm substrate) tends to disrupt the crystalline structure of the TiN film and incorporate Ar into the film.

In one embodiment, it has been found that modulating (or cycling) the substrate bias power between a high/low scheme repeatedly produces desirable bottom coverage with minimal overhang formation. Preferably, to deposit 1000 Å of a metal film over the substrate field, at least three cycles of the modulated RF bias is provided during the deposition process. Each cycle of the modulation preferably comprises applying a high bias greater than about 300 W to deposit an initial layer about 300 Å thick, followed by a low bias less than about 300 W to deposit a subsequent layer about 300 Å thick. Even more preferably, metal films between about 200 Å and 300 Å thick are deposited per cycle of the modulated RF substrate bias.

Figure 1A:
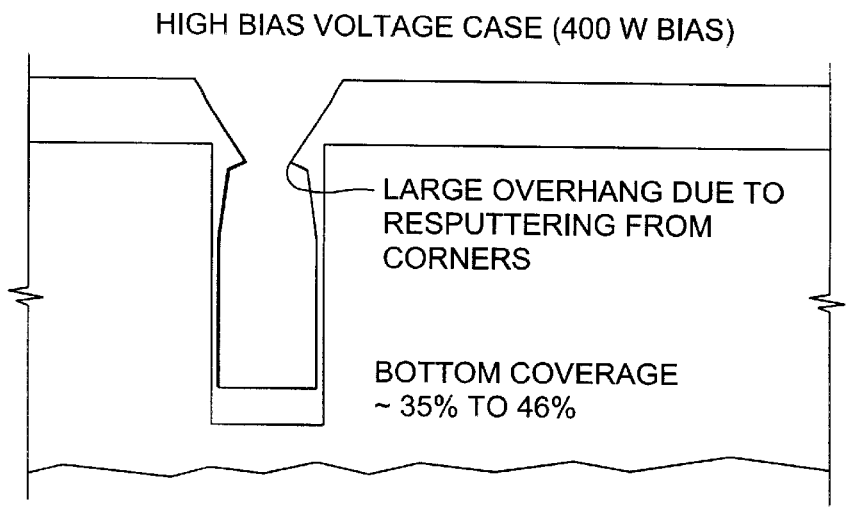
FIG. 1a is a cross sectional view of a high aspect ratio feature deposited using HDP PVD techniques at a high (≈400 W) electrostatic chuck bias.
Figure 1B:
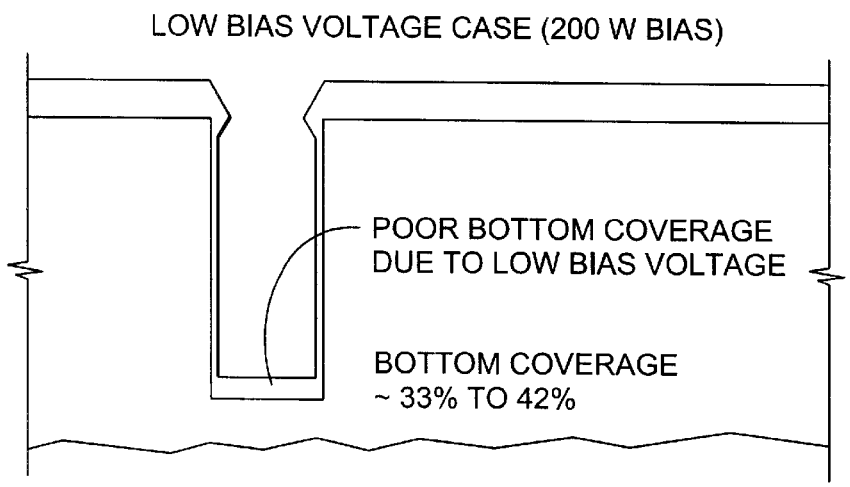
FIG. 1b is a cross sectional view of a high aspect ratio feature deposited using HDP PVD techniques at a low (≈200 W) electrostatic chuck bias.
Figure 3:
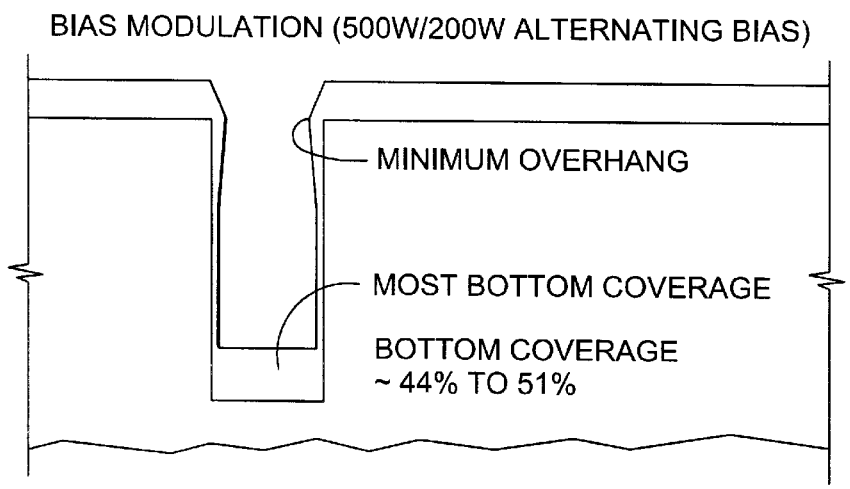
FIG. 3 is a cross sectional view of a high aspect ratio feature deposited with a TiN film using a three-cycle modulated RF bias on the substrate.

For a 200 mm substrate TiN process, it has been discovered that three cycles of 500 W/200 W alternating substrate bias produces excellent bottom coverage with minimal crowning effects. FIG. 3 is a cross sectional view of a high aspect ratio feature deposited with a TiN film using this three-cycle modulated RF bias on the substrate. As shown in FIG. 3, a TiN (1000 Å film thickness on the substrate field) deposition process with three cycles of the 500 W/200 W alternating substrate bias achieves bottom coverage between 44% and 51% while minimizing the overhang or crowning effect, as compared to FIGS. 1a and 1b where the high and low bias powers were used alone respectively. In this embodiment, a TiN film about 166 Å thick is deposited during each half cycle (either high or low bias power) of the modulated RF substrate bias. An alternative embodiment of the invention applies a high/low/high/low/high bias modulation cycle and achieves substantially similar results. The invention contemplates applications of variations of high/low and low/high cycles to effectively achieve bottom coverage and minimize overhang formation.

In general, to achieve good bottom coverage without excessive crowning effects, at least three cycles of modulation is preferred for the modulated RF substrate bias, and a deposition thickness between about 200 Å and about 300 Å is deposited during each cycle of modulation. Preferably, an equal amount of deposition occurs during each half cycle. For example, because the deposition rate depends also on the substrate bias power, the deposition time required for each half cycle can be adjusted so that about an equal thickness of deposition occurs during each half cycle.

Process conditions such as Ar flow, DC power, RF power, temperature, and pressure can be changed to optimize film properties for a given film parameter. It is important to provide consistent substrate processing conditions to achieve consistent substrate film properties. A typical processing condition for 300 Å TiN deposition in a 200 mm application provides: pedestal/heater temperature of about 200° C.; Ar flow of about 25 sccm; N$_2$ flow of about 28 sccm, chamber pressure of about 15 mT; RF coil power of about 2.5 kW; target bias voltage of about −342V; DC power of about 4 kW; and pedestal bias of about 13.56 MHz and alternating RF substrate bias power between about 500 W and about 200 W.

The following describes changes in TiN film properties according to variation of process conditions. Generally, TiN film resistance and stress are strongly dependent on substrate processing temperature, including temperature variations in the substrate, process gas, process kit, RF coil, and target. A higher processing pressure increases bottom coverage but at the same time increases non-uniformity. Film uniformity is also governed by the ratio of DC power RF power. Increasing the DC power will increase the sputtering from the target and thus increase the deposition rate. Increasing the DC to RF ratio has a tendency to deposit center-thick films. The RF power governs the plasma density, and higher RF power increases the ionization potential and bottom coverage. However, particle performance degrades with high RF power (>2.5 kW) due to the increased temperature cycle on the RF coil.

The foregoing has been described in reference to a 200 mm substrate application. It is to be understood that 100 mm, 300 mm and other size substrates may require appropriate scaling to benefit from modulated RF bias power. The power levels may be adjusted to appropriate power densities. Although the invention has been described using a RF coil to generate the high density plasma in the chamber, other plasma generators including microwave or electron cyclotron resonance (ECR) generators, can also be used effectively to generate the high density plasma usable for the invention.

While the foregoing is directed to the preferred embodiment of the present invention, other and further embodiments of the invention may be devised without departing from the basic scope thereof. The scope of the invention is determined by the claims which follow.

I claim:

1. A method for depositing a metal film on a substrate, comprising:
   (a) generating a high density plasma in a chamber;
   (b) sputtering metal from a target onto the substrate; and
   (c) applying a radio frequency (RF) bias to the substrate during deposition, the RF bias comprising a first RF bias greater than about 0.0095 W/mm$^2$ for a first portion of a cycle and a second RF bias power density less than about 0.0095 W/mm$^2$ for a second portion of the cycle, wherein the bias applied in the second portion is between about 100 watts and about 500 watts.

2. The method of claim 1 wherein the first RF bias power density is between about 0.0095 W/mm$^2$ and about 0.0159 W/mm$^2$ and the second RF bias power density is between about 0.0032 W/mm$^2$ and about 0.0095 W/mm$^2$.

3. The method of claim 1 wherein the first RF bias power density is about 0.0159 W/mm$^2$ and the second RF bias power density is about 0.0064 W/mm$^2$.

4. The method of claim 1 wherein applying a RF bias to the substrate occurs for at least two cycles.

5. The method of claim 4 wherein the deposition during each RF bias is less than about 300 Å.

6. The method of claim 1 wherein the high density plasma is generated by an inductive coil powered by an RF source at about 13.56 MHz.

7. The method of claim 1 wherein the target comprises one or more sputterable materials selected from titanium, tungsten, titanium nitride, aluminum, copper, and combinations thereof.

8. An apparatus for depositing a metal film on a substrate, comprising:
   (a) a high density plasma physical vapor deposition (HDP PVD) chamber; and
   (b) a controller which controls a RF bias power density applied to a substrate in the chamber between a first RF bias power density greater than about 0.0095 W/mm$^2$ for a first portion of a cycle and a second RF bias power density less than about 0.0095 W/mm$^2$ for a second portion of the cycle, wherein the bias applied in the second portion is between about 100 watts and about 500 watts.

9. The apparatus of 8 wherein the first RF bias power density is between about 0.0095 W/mm$^2$ and about 0.0159 W/mm$^2$ and the second RF bias power density is between about 0.0032 W/mm$^2$ and about 0.0095 W/mm$^2$.

10. The apparatus of 8 wherein the first RF bias power density is about 0.0159 W/mm$^2$ and the second RF bias power density is about 0.0064 W/mm$^2$.

11. The apparatus of claim 8 wherein the HDP PVD chamber comprises an ionized metal plasma (IMP) PVD chamber.

12. A method for depositing a metal film on a substrate, comprising:
   (a) moving a substrate into a chamber;
   (b) generating a plasma in the chamber;
   (c) sputtering material from a target; and
   (d) applying a radio frequency (RF) bias to the substrate during deposition, the RF bias comprising a first RF bias power density greater than about 0.0095 W/mm$^2$ for a first portion of a cycle and a second RF bias power density less than about 0.0095 W/mm$^2$ for a second portion of the cycle, wherein the bias applied in the second portion is between about 100 watts and about 500 watts.

13. The method of claim 12, further comprising flowing nitrogen into the chamber.

14. The method of claim 13, wherein the sputtered material comprises titanium.

15. The method of claim 13, wherein the nitrogen is flown into the chamber at a flow rate of about 10 to about 200 standard cubic centimeters per minute (sccm).

16. The method of claim 15, further comprising flowing an inert gas into the chamber at a flow rate of about 10 to about 100 sccm.

17. The method of claim 13, wherein the sputtered material comprises titanium and the nitrogen is flown into the chamber at about 30 sccm, and further comprising a chamber pressure of about 15 mTorr and a cycling RF substrate power density bias between about 0.0064 W/mm$^2$ and about 0.0159 W/mm$^2$.

18. The method of claim 12, wherein the RF bias is cycled between the first and second RF bias power densities for at least two cycles.

19. The method of claim 18, further comprising depositing about equal amounts of the sputtered material during each first and second portions of the at least two cycles.

20. The method of claim 18, wherein the RF bias is cycled for three cycles and a deposition thickness between about 200 Å and about 330 Å is deposited during each cycle.

* * * * *

UNITED STATES PATENT AND TRADEMARK OFFICE
CERTIFICATE OF CORRECTION

| | |
|---|---|
| PATENT NO. : 6,197,167 B1 | Page 1 of 1 |
| DATED : March 6, 2001 | |
| INVENTOR(S) : Tanaka | |

It is certified that error appears in the above-identified patent and that said Letters Patent is hereby corrected as shown below:

<u>Title page,</u>
Item [56], references cited, please replace "4,963,329" with "4,963,239".

Signed and Sealed this

Twenty-fifth Day of September, 2001

*Attest:*

*Attesting Officer*

NICHOLAS P. GODICI
*Acting Director of the United States Patent and Trademark Office*